United States Patent
Kimura

[11] Patent Number: 5,805,495
[45] Date of Patent: Sep. 8, 1998

[54] FERROELECTRIC SEMICONDUCTOR MEMORY AND ACCESSING METHOD THEREFOR

[75] Inventor: Tohru Kimura, Tokyo, Japan

[73] Assignee: NEC Corporation, Tokyo, Japan

[21] Appl. No.: 723,275

[22] Filed: Sep. 30, 1996

[30] Foreign Application Priority Data

Sep. 30, 1995 [JP] Japan .................................. 7-277203

[51] Int. Cl.⁶ ............................. G11C 11/22; G11C 11/24
[52] U.S. Cl. ........................ 365/145; 365/149; 365/117
[58] Field of Search ............................ 365/145, 149, 365/117

[56] References Cited

U.S. PATENT DOCUMENTS

| | | | |
|---|---|---|---|
| 5,383,150 | 1/1995 | Nakamura et al. | 365/145 |
| 5,525,528 | 6/1996 | Perino et al. | 437/7 |
| 5,572,459 | 11/1996 | Wilson et al. | 365/145 |
| 5,579,257 | 11/1996 | Tai | 365/145 |
| 5,621,680 | 4/1997 | Newman et al. | 365/145 |

OTHER PUBLICATIONS

T. Sumi et al., "A 256kb Nonvolatile Ferroelectric Memory at 3V and 100ns", *1994 IEEE International Solid–State Circuits Conference*, 1994, pp. 268–269.

H. Koike et al., "A 60ns 1Mb Nonvolatile Ferroelectric Memory with Non–driven Cell Plate Line Write/Read Scheme", *1996 IEEE International Solid–State Circuits Conference*, 1996, pp.368–369.

S. Fujii et al., "A 50 μA Standby 1MW×1b/256KW×4b CMOS DRAM", *1986 IEEE International Solid–State Circuits Conference*, 1986, pp. 266–267 and 368.

*Primary Examiner*—David C. Nelms
*Assistant Examiner*—Trong Phan
*Attorney, Agent, or Firm*—Sughrue, Mion, Zinn, Macpeak & Seas, PLLC

[57] ABSTRACT

In a memory cell composed of a ferroelectric capacitor, a binary data is stored in a dielectric component, and another binary data is stored in a ferroelectric component. Therefore, it is possible to store a binary data in one memory cell in each of a DRAM mode and an FRAM mode, with the result that two items of binary data or one item of quaternary data can be stored. Thus, a double memory capacity can be realized with the same cell size, and accordingly, it is possible to realize a high memory capacity without increasing the cell size of the semiconductor memory.

8 Claims, 6 Drawing Sheets

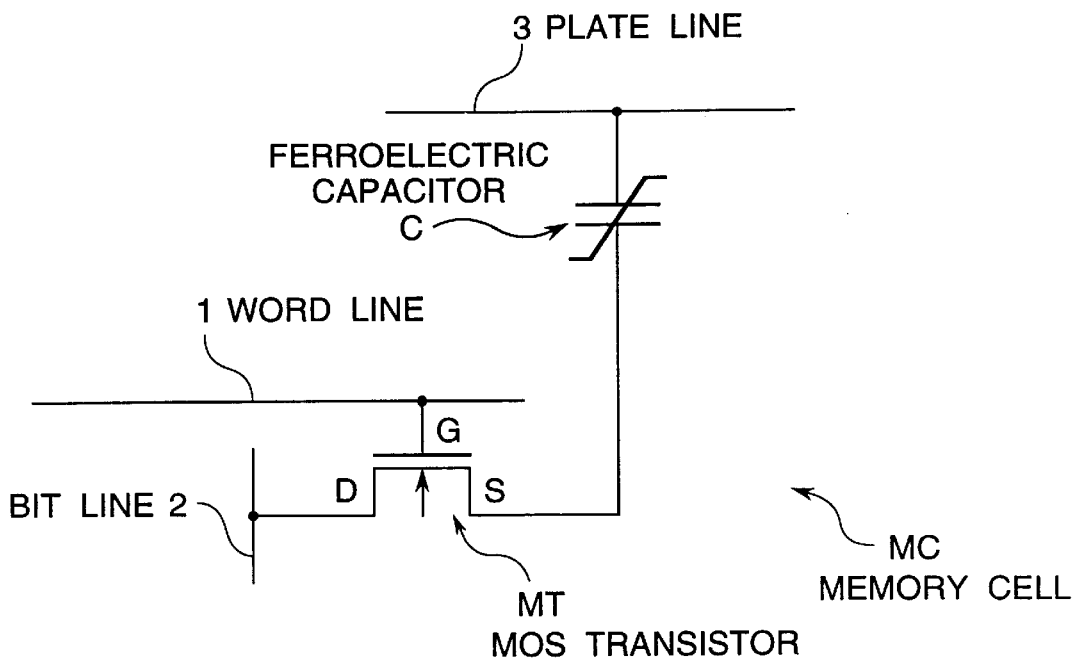
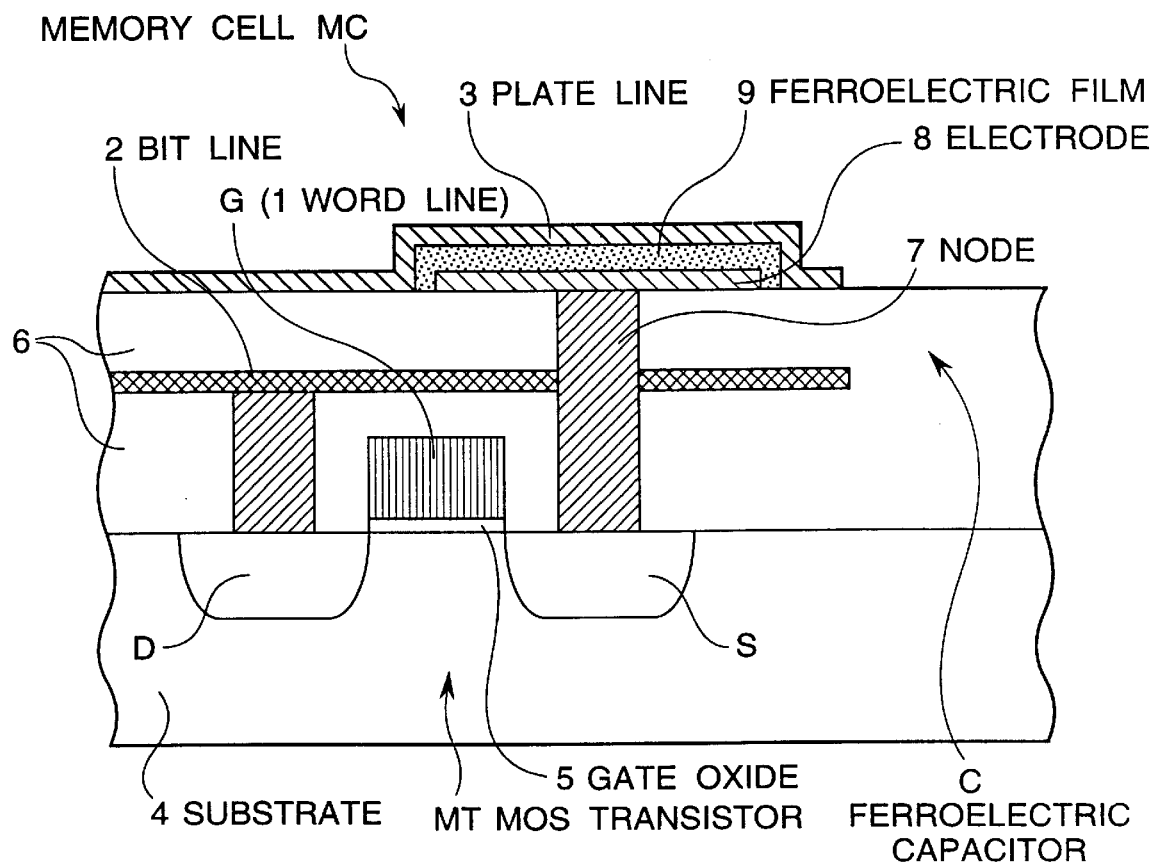

FIGURE 3
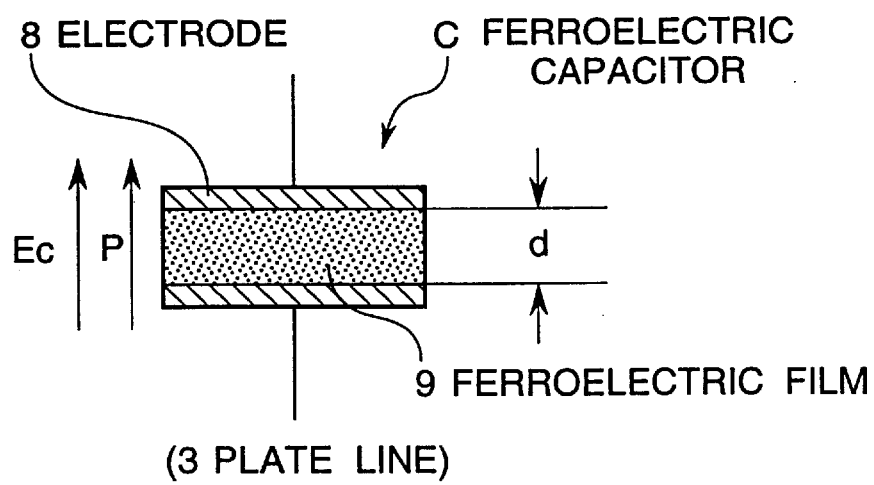
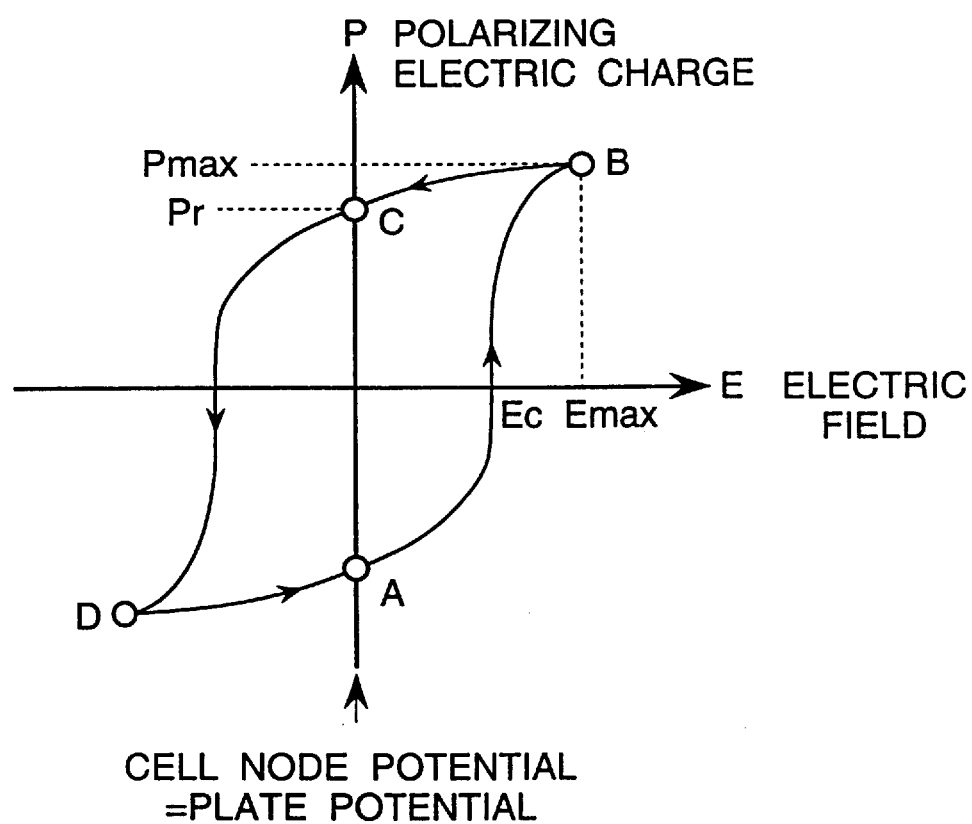

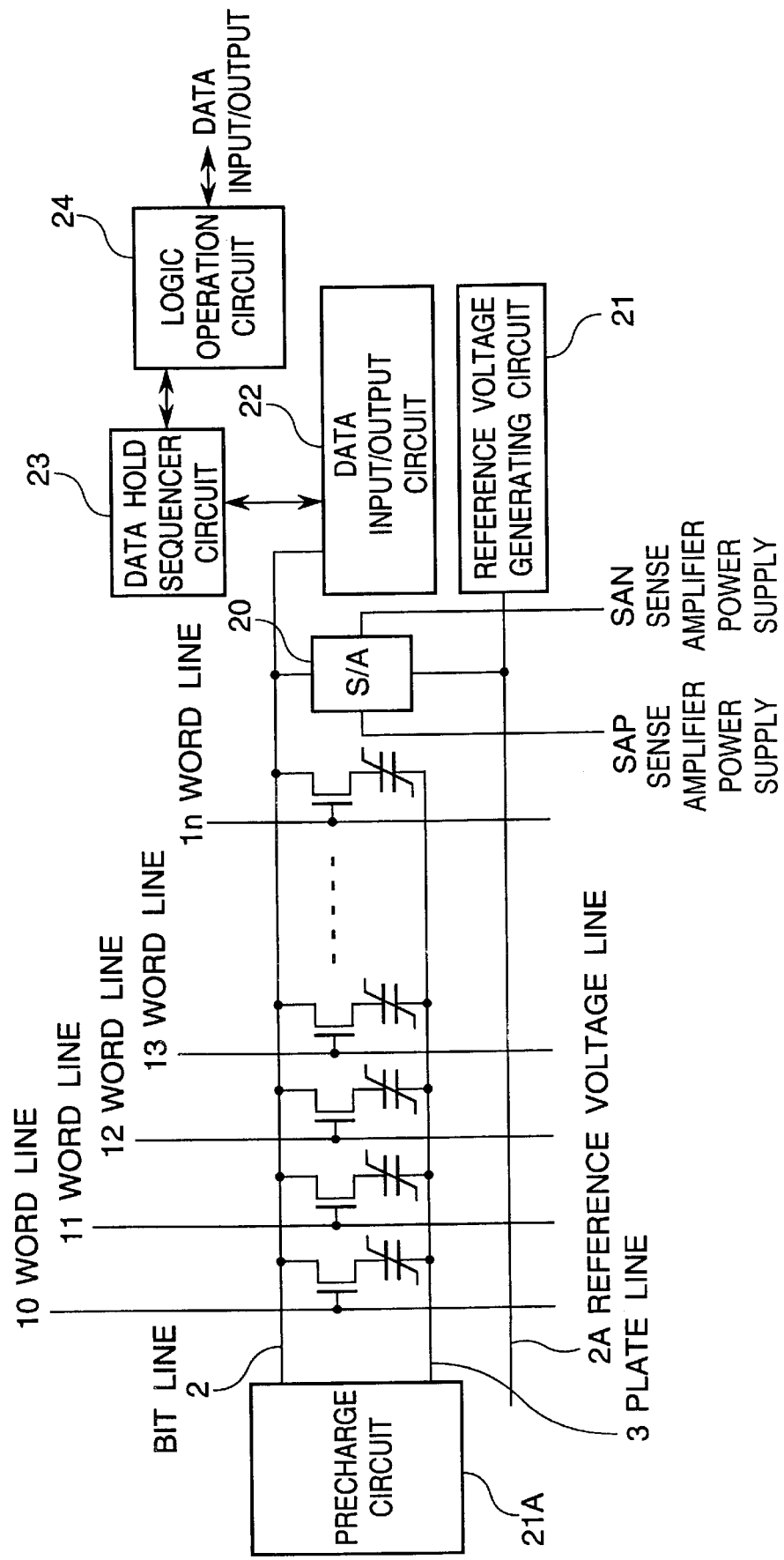

FERROELECTRIC SEMICONDUCTOR MEMORY AND ACCESSING METHOD THEREFOR

BACKGROUND OF THE INVENTION

1. Field of the Invention

The present invention relates to a nonvolatile semiconductor memory having a memory cell using a memory capacitor having a capacitor dielectric formed of a ferroelectric material, and more specifically, to such a type of semiconductor memory of a reduced power consumption and an increased memory capacity and a method for accessing the memory cell in this type semiconductor memory.

2. Description of Related Art

For example, in the field of a one-transistor and one-capacitor (abbreviated to "1T/1C") semiconductor memories, a ferroelectric material featured by a spontaneous polarization and having a large relative dielectric constant is an extremely promising material as a capacitor dielectric of a memory capacitor. However, the ferroelectric material used in industry at present is an oxide typified by lead zirconate titanate (PTZ), which causes a reduction reaction at a junction boundary with a different kind of material. The ferroelectric material having caused the reduction reaction is deteriorative in electric characteristics, and therefore, can no longer be used in a memory. Accordingly, in the case of using the ferroelectric material as a capacitor dielectric of a memory capacitor, it is necessary to use a noble metal such as gold (Au) or platinum (Pt) as a capacitor plate material.

Since the noble metal has less reactivity, the noble metal is stable at a heterojunction boundary between the noble metal and an oxide including the ferroelectric material. To the contrary, it is not possible to use an etching technology which is now widely used in a semiconductor micro fabrication. This is a hindrance in microminiaturizing the memory cell of the semiconductor memory. For example, T. Sumi et al, "A 256 kb Nonvolatile Ferroelectric Memory at 3V and 100 ns", 1994 IEEE International Solid-State Circuits Conference, Digest of Technical Papers, Vol. 37, FA16.2, pp 268–269, the disclosure of which is incorporated by reference in its entirety into this application, proposes a one-transistor and one-capacitor (1T/1C) memory cell using a ferroelectric material, which needs the cell size of 85.5 $\mu m^2$ in the case of using a 1.2 $\mu m$ CMOS technology.

On the other hand, in a conventional DRAM (dynamic random access memory) as proposed by S. Fujii et al, "A 50 $\mu A$ Standby 1MW×1b/256KW×4b CMOS DRAM", 1986 IEEE International Solid-State Circuits Conference, Digest of Technical Papers, Vol. 29, FAM19.4, pp266–267 and 368, the disclosure of which is incorporated by reference in its entirety into this application, the cell size is on the order of 29.16 $\mu m^2$ in the case of using a 1.2 $\mu m$ CMOS technology. Accordingly, the cell size of the memory using the ferroelectric capacitor reaches about three times the conventional DRAM cell size, in the case of using the semiconductor micro fabrication technology of the same level.

Accordingly, it is difficult to realize a high integration density and a large memory capacity, which are very important features required in the semiconductor memory.

SUMMARY OF THE INVENTION

Accordingly, it is an object of the present invention to provide a ferroelectric semiconductor memory which has overcome the above mentioned defect of the conventional one.

Another object of the present invention is to provide a ferroelectric semiconductor memory capable of realizing a high integration density, a large memory capacity, and a low electric power consumption, and a method for accessing to the ferroelectric semiconductor memory.

The above and other objects of the present invention are achieved in accordance with the present invention by a semiconductor memory having at least a memory cell having a memory capacitor having a capacitor dielectric formed of a ferroelectric material, the semiconductor memory comprising means for storing a first binary data in the memory cell by using a dielectric component of the ferroelectric material and a second binary data in the memory cell by using a ferroelectric component of the ferroelectric material.

The semiconductor memory further includes means for reading out the first binary data written in the memory cell by using the dielectric component of the ferroelectric material and the second binary data written in the memory cell by using the ferroelectric component of the ferroelectric material, and means receiving the read-out first binary data and the read-out second binary data, for outputting a quaternary data obtained from a logical operation on the basis of the read-out first binary data and the read-out second binary data.

In addition, the semiconductor memory further includes means for supplying to a sense amplifier a first reference voltage when data to be stored by using the ferroelectric component of the ferroelectric material is written and when data stored by using the ferroelectric component of the ferroelectric material is read out, and a second reference voltage different from the first reference voltage, when data to be stored by using the ferroelectric component of the dielectric material is written and when data stored by using the dielectric component of the ferroelectric material is read out.

According to another aspect of the present invention, there is provided a method for accessing a semiconductor memory having at least a memory cell having a memory capacitor having a capacitor dielectric formed of a ferroelectric material, the method comprising, at the time of writing data into the memory cell, the steps of formerly writing a binary data by using a ferroelectric component of the ferroelectric material, and later writing a binary data by using a dielectric component of the ferroelectric material. At the time of reading data from the memory cell, the method includes the steps of formerly reading a first binary data written in the memory cell by using the dielectric component of the ferroelectric material, and later reading a binary data written in the memory cell by using the ferroelectric component of the ferroelectric material.

The above and other objects, features and advantages of the present invention will be apparent from the following description of preferred embodiments of the invention with reference to the accompanying drawings.

BRIEF DESCRIPTION OF THE DRAWINGS

FIG. 1 is a circuit diagram of a memory cell in accordance with the present invention using a ferroelectric memory capacitor;

FIG. 2 is a diagrammatic sectional view of the memory cell shown in FIG. 1;

FIG. 3 illustrates a diagrammatic structure of a ferroelectric capacitor and a hysteresis characteristics of the ferroelectric capacitor;

FIG. 7 is a circuit diagram of another embodiment of the semiconductor memory in accordance with the present invention.

DESCRIPTION OF THE PREFERRED EMBODIMENTS

Figure 4:
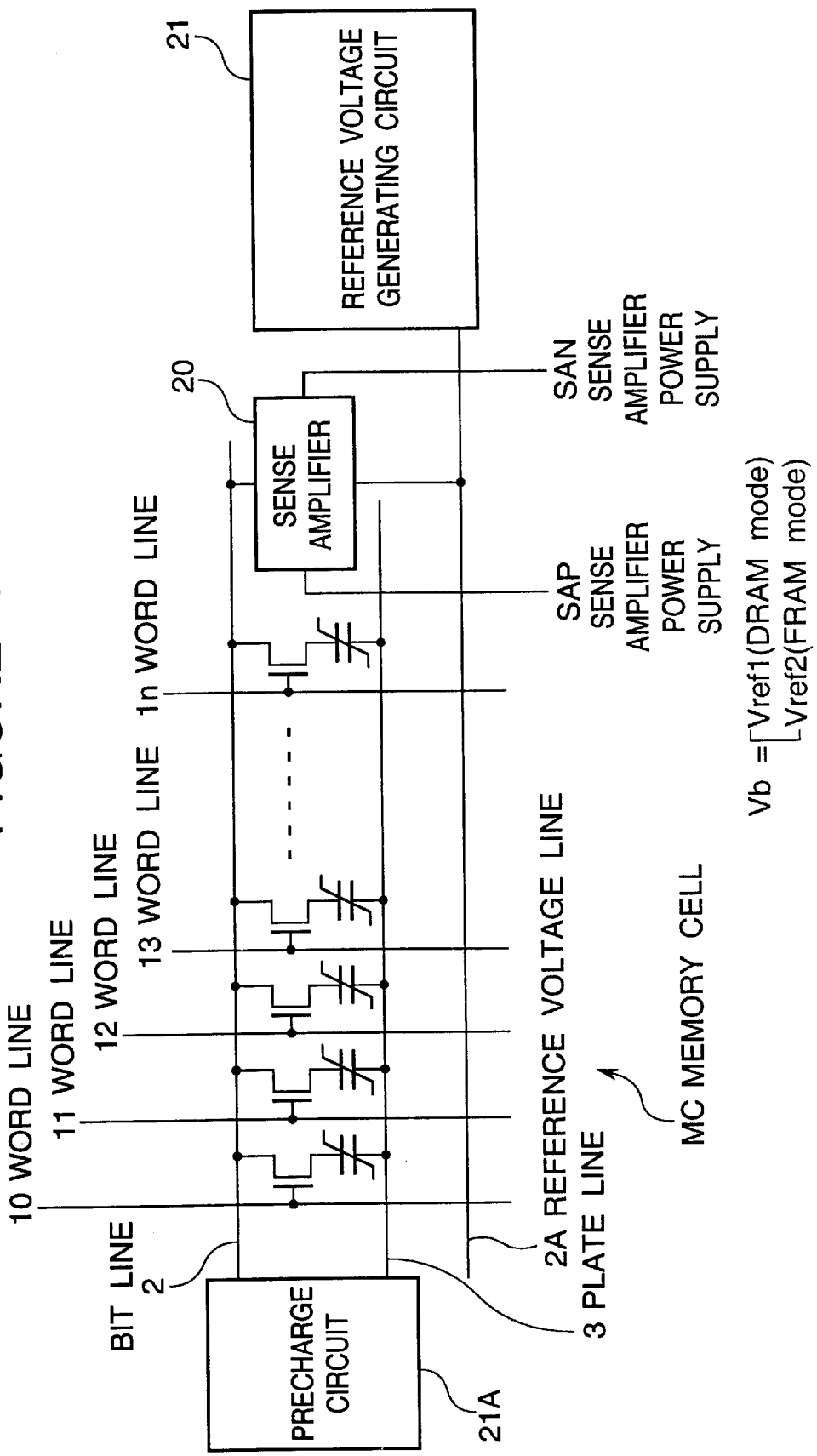
FIG. 4 is a circuit diagram of an embodiment of the semiconductor memory in accordance with the present invention.

Referring to FIG. 1, there is shown a circuit diagram of a 1T/1C memory cell in accordance with the present invention using a ferroelectric memory capacitor. FIG. 2 is a diagrammatic sectional view of the memory cell shown in FIG. 1.

The shown memory cell is generally designated by Reference Sign MC, and includes a MOS transistor MT formed in a semiconductor substrate 4, and a gate G of the MOS transistor MT is connected to a word line 1. A drain D of the MOS transistor MT is connected to a bit line 2, and a source S of the MOS transistor MT is connected to one electrode of a pair of plates or electrodes of a memory capacitor C having a dielectric layer formed of a ferroelectric material. The other electrode of the memory capacitor C is connected to a plate line (power supply line) 3.

In FIG. 2, Reference Numeral 5 designates a gate oxide film, and Reference Numeral 6 shows an interlayer insulator film. Reference Numeral 7 indicates a connection node (contact) between the source S of the MOS transistor MT and the one electrode or plate of the memory capacitor C, and Reference Numeral 8 designates the one electrode of the memory capacitor C. Reference Numeral 9 shows the ferroelectric material film of the memory capacitor C. A portion of the plate line 3 covering the ferroelectric material film 9 functions as the other electrode or plate of the memory capacitor C.

As seen from the above, the shown memory cell MC is of the 1T/1C memory cell type, and in order to prevent a reduction reaction between the ferroelectric material film and the electrodes, the one electrode 8 of the memory capacitor C and the other electrode of the memory capacitor C constituted of the portion of the plate line 3, are formed of a noble metal such as Au or Pt. Therefore, it is not possible to use a reactive etching which is conventionally used in a semiconductor micro fabrication technology. Therefore, these electrodes are patterned by using an ion milling which carries out a patterning by action of a physical etching, not by a chemical reaction. In the ion milling, an etched-out material is redeposited, differently from the reactive etching in which the etched-out material is removed in the form of volatile molecules. Therefore, it is difficult to realize fine patterning using ion milling. Accordingly, as mentioned hereinbefore, the memory cell using the ferroelectric material inevitably has a cell size larger than that of a conventional DRAM cell.

Under the above mentioned disadvantage of the ferroelectric memory cell, the present invention realizes an increase of a memory capacity, by multiplexing a polarization of the ferroelectric material to the effect that one memory capacitor assumes four different conditions.

Referring to a hysteresis characteristics of the ferroelectric material shown in FIG. 3, assuming that a thickness of the ferroelectric material film is "d", when an electric voltage larger than Vc=Ec●d is applied, the polarization is inverted. Here, Ec is a coercive electric field, which is an electric property inherent to the ferroelectric material, and is determined by the kind and the film quality of the ferroelectric material. When the power supply for the memory using the ferroelectric material is shut off, there exist two stable conditions indicated by the point "A" and the point "C" in FIG. 3, and therefore, it is possible to memorize data by use of this polarization. In this specification, the stable conditions of the point "A" and the point "C" will be called a "FRAM mode". In addition, the ferroelectric material involves not only a ferroelectric component, but also a dielectric component. Therefore, it is possible to use the points "C" and "B" or the points "A" and "D" for memorizing data, similarly to the conventional DRAM. In this specification, the points "B" and "D" will be called a "DRAM mode".

Here, the four stable conditions on the hysteresis characteristics will be examined in the 1T/1C ferroelectric memory cell shown in FIGS. 1 and 2. Assuming that when the word line 1 is at a logic low level, the ferroelectric capacitor is in the condition shown by the points "D" or "B", if the word line 1 is brought from the logic low level to a logic high level, the condition of the point "D" changes to the condition of the point "A", so that an electric charge of −(Pmax−Pr) is discharged. Similarly, the condition of the point "B" changes to the condition of the point "C", with discharge of an electric charge of (Pmax−Pr).

Now, consider that, as shown in FIG. 4, the bit line 2 of a plurality of ferroelectric memory cells MC are connected in common to each other and the plate line 3 of the same ferroelectric memory cells MC are connected in common to each other, and for reading out data from the memory cell, a potential of the bit line 2 is compared, by a sense amplifier circuit 20, with a reference voltage supplied from a reference voltage generating circuit 21 to a reference voltage line 2A. Here, also assume that Vdd is a high level voltage and Vss is a low level voltage. The bit line 2 and the plate line 3 are precharged to a potential of (Vdd−Vss)/2 by a precharge circuit 21A, and the word lines 10, 11, 12, ●,●,●, 1n is caused to change from the logic low level to the logic high level.

Assuming that the bit line 2 and the reference voltage line 2A have a capacitance of $C_B$, when the conditions of the point "D" and the point "B" transits to the conditions of the point "A" and the point "C", respectively, the potential of the bit line is caused to change by the following amounts, respectively:

−(Pmax−Pr)/$C_B$; (Pmax−Pr)/$C_B$

In FIG. 4, Reference Signs "SAP" and "SAN" indicate sense amplifier activating signals, which are ordinarily precharged to the potential of (Vdd−Vss)/2, and then, are brought to Vdd and Vss, respectively, after the potential of the bit line is established, for the purpose of activating the sense amplifier circuit 20.

Here, in the case that |Pmax−Pr|/$C_B$ is sufficiently larger than a noise level Vnoise appearing on the bit line, if the potential of (Vdd−Vss)/2 is supplied to the sense amplifier circuit as a reference voltage Vref1, the memory cell, which stores the data in the condition of the point "B", causes a voltage change of (Pmax−Pr)/$C_B$ on the bit line in response to the transition of the word line from the logic low level to the logic high level, and therefore, the potential of the bit line becomes as follows:

{(Vdd−Vss)/2}+{(Pmax−Pr)/$C_B$}

On the other hand, if the memory cell is already in the condition of the point "C", the potential of the bit line does not change. Accordingly, the condition of the point "B" and the condition of the point "C" can distinguishably read out.

Similarly, the memory cell, which stores the data in the condition of the point "D", causes a voltage change of −(Pmax−Pr)/CB on the bit line.

Figure 5:
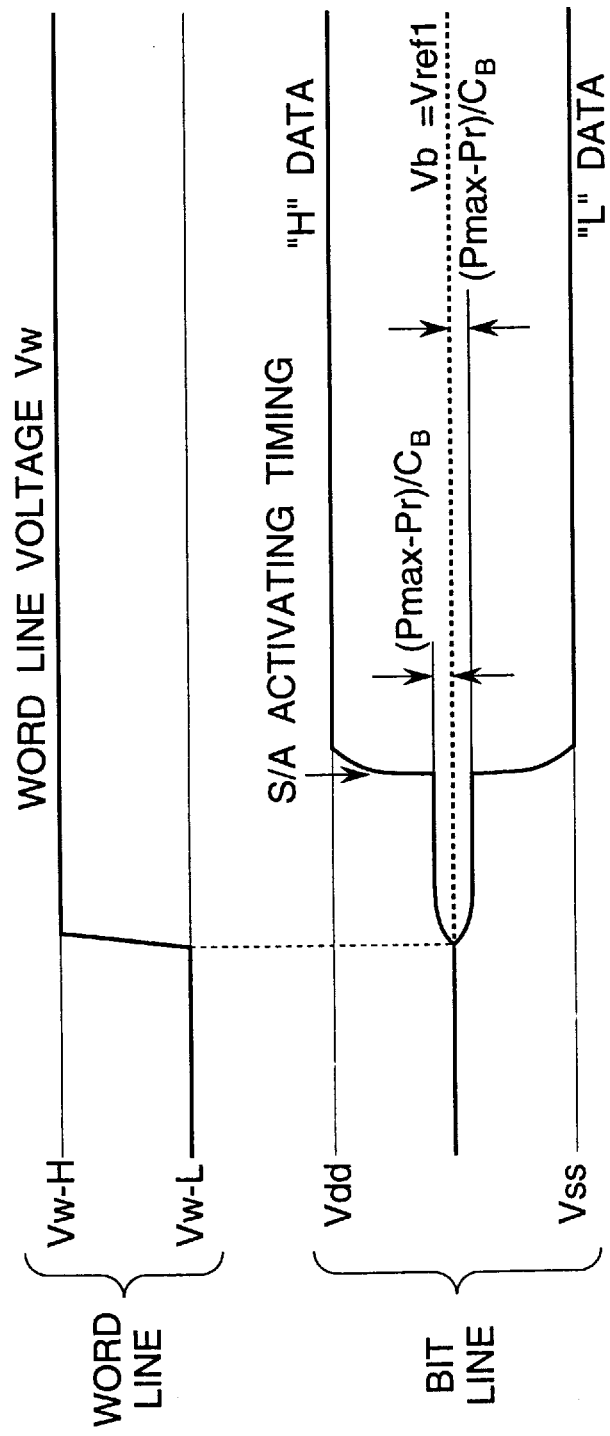
FIG. 5 is a data read timing chart in a DRAM mode utilizing a dielectric component in the memory cell in accordance with the present invention.

Since the sense amplifier circuit 20 amplifies a voltage difference between the bit line 2 and the reference voltage line 2A, activation of the sense amplifier (S/A) 20 results in that the condition of the point "B" brings the bit line 2 to Vdd, and the condition of the point "C" brings the bit line 2 to Vss. A voltage change of the bit line occurring at this time is shown in FIG. 5.

The voltage change caused on the bit line 2 by the points "B" and "C", is similarly caused by using the points "D" and "A". This is similar to the reading method of the conventional DRAM. In this case, it is also sufficient if (Vdd−Vss)/2 is used as the reference voltage for the sense amplifier 20.

Figure 6:
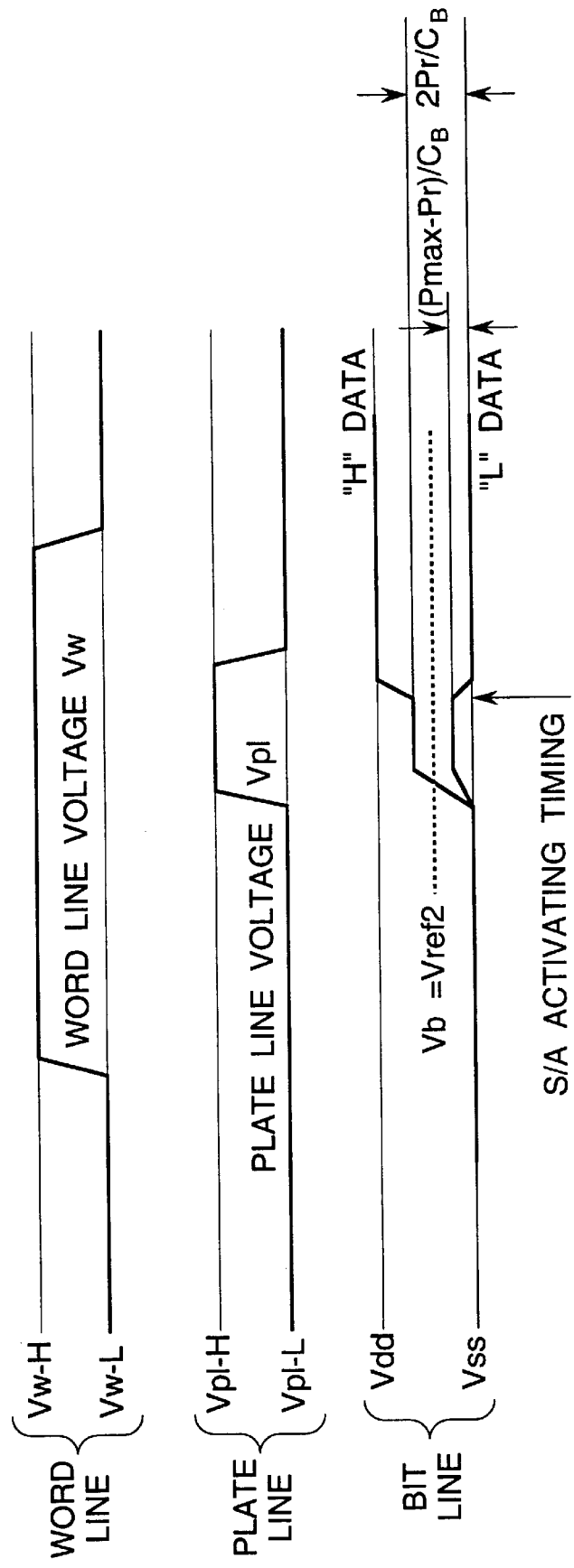
FIG. 6 is a data read timing chart in a FRAM mode utilizing a ferroelectric component in the memory cell in accordance with the present invention.

Next, explanation will be made about how to read information of the points "C" and "A", This is similar to a reading method for a conventional ferroelectric memory, and disclosed by Sumi et al paper quoted hereinbefore. Therefore, a detailed explanation of this reading method will be omitted, but this reading method is illustrated in FIG. 6. In this case, the bit line potential and the SAP node and the SAN node of the sense amplifier circuit 20 are precharged to the low level voltage Vss, and a voltage Vref2 fulfilling the relation of $\{2Pr/C_B\} > Vref2 > \{(Pmax-Pr)/C_B\}$ is used as the reference voltage.

By using the above mentioned two reading methods, it is possible to read out the information corresponding to the points "A", "B", "C" and "D" shown in FIG. 3, respectively. Here, if information in the FRAM is first read out, the information held in the DRAM mode is destroyed. Therefore, at the time of reading, it is necessary that the reading of the DRAM mode is formerly carried out, and the reading of the FRAM mode is carried out later. Thus, two items of binary data (namely, two bits of data) can be read out.

The reading of a quaternary data can realized by preserving a binary data read out in the DRAM mode and obtaining a logic sum between the binary data read out in the DRAM mode and the binary data read out in the FRAM mode. This reading can be realized in a circuit shown in FIG. 7, which is a circuit diagram of another embodiment of the semiconductor memory in accordance with the present invention. In FIG. 7, elements similar to those shown in FIG. 4 are given the same Reference Numerals and Signs, and explanation thereof will be omitted.

As seen from comparison between FIGS. 4 and 7, the second embodiment includes, in addition to the first embodiment, a data input/output circuit 22 connected to the bit line 2 to which the sense amplifier circuit 20 is connected, a data hold and sequencer circuit 23 connected to the data input/output circuit 23, and a logic operation circuit 24 associated with the data hold and sequencer circuit 22. With this arrangement, two items of binary data sequentially read out to the data input/output circuit 22 by the sense amplifier circuit 20 on the basis of the difference potential between the bit line 2 and the reference voltage line 2A, are similarly sequentially received and held in the data hold and sequencer circuit 23, and then, are converted into one item of quaternary data by the logic operation circuit 24, so that the obtained quaternary data is outputted to an external device. At a writing time, one item of quaternary data to be written supplied from the external device, is converted, by the logic operation circuit 24, into two items of binary data, which are, in turn, held in the data hold and sequencer circuit 23, and sequentially supplied from the data hold and sequencer circuit 23 to the data input/output circuit 22, so that a potential based on the two sequentially supplied items of binary data is supplied from the data input/output circuit 22 to the bit line 2 in order, and sequentially written into a corresponding ferroelectric memory cell.

In the case of writing data into the memory cell, in each of the DRAM mode and the FRAM mode, the potential of the plate line 3 is maintained at a corresponding voltage shown in FIG. 3, and the word line is brought to the high level, so that a predetermined voltage is applied across the ferroelectric capacitor C, with the result that the writing can be made. In brief, if the voltage Vp of the plate line 3 and the voltage Vb of the bit line 2 are controlled by the precharge circuit 21A to apply the voltage of Emax●d between the plate line 3 and the node 7 (where "d" is the thickness of the ferroelectric film 9 as mentioned hereinbefore), the writing of the point "B" can be made, and thereafter, if the plate line voltage Vp and the bit line voltage Vb are controlled by the precharge circuit 21A to make the voltage between the plate line 3 and the node 7 to 0 (zero), the writing of the point "C" can be made. If the plate line voltage Vp and the bit line voltage Vb are controlled by the precharge circuit 21A to apply the voltage of −Emax●d between the plate line 3 and the node 7, the writing of the point "D" can be made, and thereafter, if the plate line voltage Vp and the bit line voltage Vb are controlled by the precharge circuit 21A to make the voltage between the plate line 3 and the node 7 to 0 (zero), the writing of the point "A" can be made.

Here, if the data to be held in the DRAM mode is formerly written and the data to be held in the FRAM mode is later written, the data in the DRAM mode formerly written is destroyed. Therefore, in the case of writing data into the memory cell, it is necessary that the data writing of the FRAM mode is formerly carried out, and then, the data writing of the DRAM mode is later carried out.

In addition, the quaternary data can be written by preserving a binary data to be written in the DRAM mode, and formerly writing the binary data to be written in the FRAM mode, and then, later writing the binary data to be written in the DRAM mode.

As described above, the present invention is characterized that, in a memory cell composed of a ferroelectric capacitor, a binary data is stored in a dielectric component, and another binary data is stored in a ferroelectric component, with the result that two items of binary data or one item of quaternary data can be stored. Therefore, it is possible to have a double memory capacity with the same cell size, and therefore, it is possible to realize a high memory capacity without increasing the cell size of the semiconductor memory.

Furthermore, the memory cell in accordance with the present invention includes a logic circuit for obtaining a logic processing result between the data stored by utilizing the ferroelectric component and the data stored by utilizing the dielectric component, and a reference voltage generating means for supplying different reference voltages to the sense amplifier, so that the date stored in the memory cell is discriminated with the different reference voltages, with the result that two items of binary data or one item of quaternary data can be read out.

The invention has thus been shown and described with reference to the specific embodiments. However, it should be noted that the present invention is in no way limited to the details of the illustrated structures but changes and modifications may be made within the scope of the appended claims.

I claim:

1. A semiconductor memory device, comprising:

a memory cell including a memory capacitor having a capacitor dielectric formed of a ferroelectric material, wherein said ferroelectric material includes a ferroelectric component and a dielectric component; and means coupled to said memory capacitor for storing a first binary data and a second binary data in said memory cell, wherein said first binary data is stored using said dielectric component of said ferroelectric material and said second binary data is stored using said ferroelectric component of said ferroelectric material, so that two bits of data may be stored in said memory cell.

2. A semiconductor memory according to claim 1, further comprising:

means for reading out said first binary data stored in said memory cell by using the dielectric component of said ferroelectric material and said second binary data stored in said memory cell by using the ferroelectric component of said ferroelectric material, said reading means coupled to said memory cell; and means for outputting a quaternary data obtained from a logical operation on the basis of said first binary data read from said memory cell and said second binary data read from said memory cell, wherein said quaternary data outputting means is coupled to said reading means for receiving said first binary data and said second binary data from said reading means.

3. A semiconductor memory according to claim 2, further comprising:

a sense amplifier connected to said memory cell; and means for supplying to said sense amplifier a first reference voltage and a second reference voltage, said first reference voltage being supplied when data to be stored using the ferroelectric component of said ferroelectric material is written and when data stored using the ferroelectric component of said ferroelectric material is read out, said second reference voltage being supplied when data to be stored using the ferroelectric component of said dielectric material is written and when data stored using the dielectric component of said ferroelectric material is read out.

4. A semiconductor memory according to claim 1, further comprising:

a sense amplifier connected to said memory cell; and means for supplying to said sense amplifier a first reference voltage and a second reference voltage, said first reference voltage being supplied when data to be stored using the ferroelectric component of said ferroelectric material is written and when data stored using the ferroelectric component of said ferroelectric material is read out, said second reference voltage being supplied when data to be stored using the ferroelectric component of said dielectric material is written and when data stored using the dielectric component of said ferroelectric material is read out.

5. A method for accessing a semiconductor memory comprising a memory cell including a memory capacitor having a capacitor dielectric formed of a ferroelectric material, the method comprising the steps of:

writing a first binary data to said memory cell by using a ferroelectric component of said ferroelectric material; and writing a second binary data to said memory cell by using a dielectric component of said ferroelectric material.

6. A method for accessing a semiconductor memory comprising a memory cell including a memory capacitor having a capacitor dielectric formed of a ferroelectric material, the method comprising the steps of:

reading a first binary data written in said memory cell by using a dielectric component of said ferroelectric material; and reading a second binary data written in said memory cell by using a ferroelectric component of said ferroelectric material.

7. A semiconductor memory device, comprising:

a memory cell, said memory cell comprising:

a memory capacitor including a first electrode coupled a plate line, a second electrode, and a dielectric formed of a ferroelectric material having a dielectric component and a ferroelectric component, and a transistor having a source electrode, a gate electrode and a drain electrode, wherein said source electrode is coupled to said second electrode of said memory capacitor, said gate electrode is coupled to a word line, and said drain electrode is coupled to a bit line, and wherein a first binary data in stored in said memory cell using said dielectric component of said ferroelectric material and a second binary data is stored in said memory cell using said ferroelectric component of said ferroelectric material so that two bits of data may be stored in said memory cell.

8. A semiconductor memory according to claim 7, further comprising:

a sense amplifier coupled to said bit line for comparing a potential of said bit line with a reference voltage; and means for supplying to said sense amplifier a first reference voltage for storing and reading data using the ferroelectric component of said ferroelectric material and a second reference voltage for storing and reading data using the ferroelectric component of said dielectric material.

* * * * *

UNITED STATES PATENT AND TRADEMARK OFFICE
CERTIFICATE OF CORRECTION

PATENT NO. : 5,805,495
DATED : September 8, 1998
INVENTOR(S) : Tohru KIMURA

It is certified that error appears in the above-identified patent and that said Letters Patent is hereby Col. 5, line 3, change "CB" to --$C_B$--.

Col. 5, line 52, change "23" to --22--.

Col. 5, line 53, change "22" to --23--.

Signed and Sealed this

Twentieth Day of April, 1999

Attest:

Q. TODD DICKINSON

*Attesting Officer*       Acting Commissioner of Patents and Trademarks